(12) United States Patent
Kosaka

(10) Patent No.: US 11,307,490 B2
(45) Date of Patent: *Apr. 19, 2022

(54) PHASE SHIFT MASK BLANK AND PHASE SHIFT MASK

(71) Applicant: Shin-Etsu Chemical Co., Ltd., Tokyo (JP)

(72) Inventor: Takuro Kosaka, Joetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 68 days.

This patent is subject to a terminal disclaimer.

(21) Appl. No.: 16/832,395

(22) Filed: Mar. 27, 2020

(65) Prior Publication Data
US 2020/0310241 A1    Oct. 1, 2020

(30) Foreign Application Priority Data

Mar. 29, 2019 (JP) .............................. JP2019-067065
Jun. 14, 2019 (JP) .............................. JP2019-111026

(51) Int. Cl.
*G03F 1/32*    (2012.01)

(52) U.S. Cl.
CPC ..................... *G03F 1/32* (2013.01)

(58) Field of Classification Search
None
See application file for complete search history.

(56) References Cited

U.S. PATENT DOCUMENTS

| 4,737,015 A * | 4/1988 | Ishida ................... G02B 6/132 385/130 |
| 5,474,864 A | 12/1995 | Isao et al. |
| 5,514,499 A * | 5/1996 | Iwamatsu ............... G03F 1/26 430/5 |

(Continued)

FOREIGN PATENT DOCUMENTS

| JP | 7-140635 A | 6/1995 |
| JP | 2002-40625 A | 2/2002 |

(Continued)

OTHER PUBLICATIONS

Extended European Search Report for European Application No. 20163731.1, dated Sep. 7, 2020.

(Continued)

*Primary Examiner* — Martin J Angebranndt
(74) *Attorney, Agent, or Firm* — Birch, Stewart, Kolasch & Birch, LLP.

(57) ABSTRACT

Provided is a phase shift mask blank including a substrate, and a phase shift film thereon, the phase shift film composed of a material containing silicon and nitrogen and free of a transition metal, the phase shift film including at least one compositionally graded layer having a composition continuously varying in a thickness direction, and a refractive index n and an extinction coefficient k, with respect to exposure light, varying in the thickness direction, the exposure light being KrF excimer laser, the compositionally graded layer having a difference between a maximum refractive index n(H) and a minimum refractive index n(L) of up to 0.40, and (Continued)

a difference between a maximum extinction coefficient k(H) and a minimum extinction coefficient k(L) of up to 1.5.

8 Claims, 2 Drawing Sheets

(56) References Cited

U.S. PATENT DOCUMENTS

| | | | |
|---|---|---|---|
| 5,547,787 A | | 8/1996 | Ito et al. |
| 5,629,114 A | | 5/1997 | Isao et al. |
| 5,691,090 A | | 11/1997 | Isao et al. |
| 5,985,493 A | * | 11/1999 | Liddle ................ G03F 1/20 430/5 |
| 7,767,366 B2 | | 8/2010 | Yoshikawa et al. |
| 8,003,284 B2 | | 8/2011 | Yoshikawa et al. |
| 8,012,654 B2 | | 9/2011 | Yoshikawa et al. |
| 10,146,122 B2 | * | 12/2018 | Kosaka ................ G03F 1/68 |
| 2010/0215950 A1 | * | 8/2010 | Schultz ............ C23C 14/0676 428/336 |
| 2015/0125785 A1 | * | 5/2015 | Inazu ................ G03F 1/26 430/5 |
| 2016/0033858 A1 | * | 2/2016 | Kosaka ................ G03F 1/26 430/5 |
| 2017/0212417 A1 | * | 7/2017 | Kosaka ................ G03F 1/68 |
| 2018/0088457 A1 | * | 3/2018 | Inazu ................ G03F 1/32 |
| 2019/0064650 A1 | | 2/2019 | Kosaka et al. |
| 2020/0310240 A1 | * | 10/2020 | Kosaka ................ G03F 1/80 |

FOREIGN PATENT DOCUMENTS

| | | |
|---|---|---|
| JP | 2007-33469 A | 2/2007 |
| JP | 2007-233179 A | 9/2007 |
| JP | 2007-241065 A | 9/2007 |

OTHER PUBLICATIONS

Ito et al., "Optimization of optical properties for single-layer halftone masks," SPIE, vol. 2197, Mar. 2, 1994, pp. 99-110.

Smith et al., "Development and characterization of nitride and oxide based composite materials for sub 0.18 μm attenuated phase shift masking," Microelectronic Engineering, vol. 35, 1997, pp. 201-204.

* cited by examiner

PHASE SHIFT MASK BLANK AND PHASE SHIFT MASK

CROSS-REFERENCE TO RELATED APPLICATION

This non-provisional application claims priority under 35 U.S.C. § 119(a) on Patent Application Nos. 2019-067065 and 2019-111026 filed in Japan on Mar. 29, 2019 and Jun. 14, 2019, respectively, the entire contents of which are hereby incorporated by reference.

TECHNICAL FIELD

The invention relates to a phase shift mask blank and a phase shift mask, typically used for manufacturing a semiconductor integrated circuit.

BACKGROUND ART

In a photolithography technique used in a semiconductor technology, a phase shift method is used as one of a resolution enhancement technology. The phase shift method is a contrast enhancing method by forming a phase shift film pattern disposed on a transparent substrate being a photomask substrate which is transparent to exposure light, and utilizing interference of lights. The phase shift film pattern has a phase shift of approximately 180° that is a difference between a phase through the phase shift film and a phase through a portion that is not formed the phase shift film, in other word, a phase through air having a length same as the thickness of the phase shift film. A halftone phase shift mask is one of the photomasks employing such method. The halftone phase shift mask includes a transparent substrate made of quartz or the like which is transparent to exposure light, and a mask pattern of a halftone phase shift film which is formed on the transparent substrate and has a phase shift of approximately 180° to a phase through a portion not formed the phase shift film, and a transmittance substantively insufficient to contribute to exposure. As a phase shift film for a halftone phase shift mask, a film containing molybdenum and silicon is mostly used. As such a film, a halftone phase shift film composed of molybdenum silicon oxide or molybdenum silicon oxynitride is known (JP-A H07-140635 (Patent Document 1)).

CITATION LIST

Patent Document 1: JP-A H07-140635
Patent Document 2: JP-A 2007-33469
Patent Document 3: JP-A 2007-233179
Patent Document 4: JP-A-2007-241065

DISCLOSURE OF INVENTION

As a phase shift film for exposure light of KrF excimer laser (wavelength of 248 nm) generally used, a phase shift film composed of a material containing molybdenum and silicon, and has a phase shift of 180° and a transmittance of approximately 6%. In this case, the phase shift film has a thickness of approximately 100 nm. Recently, for a phase shift film used with ArF excimer laser (wavelength of 193 nm) as exposure light, a phase shift film of silicon nitride has been used for the purposes of minimizing film thickness and enhancing washing resistance and light resistance. Although not much as exposure light of ArF excimer laser, also when KrF excimer laser is used as the exposure light, the phase shift film having high washing resistance and high light resistance and being hard to generate haze is needed.

When a phase shift film used with KrF excimer laser as exposure light is made of silicon nitride, if the phase shift film is formed to a single layer having single composition (uniform composition in thickness direction) having a refractive index n and an extinction coefficient k corresponding to a phase shift of 170 to 190° and a transmittance of 4 to 8%, the film is formed under a film-forming condition of unstable region (so-called transition mode region) is employed in reactive sputtering, thus, the film has a problem that in-plane uniformity of optical characteristics becomes worse.

Meanwhile, to obtain a film having high in-plain uniformity of optical characteristics, it is conceivable that a phase shift film composed of silicon nitride is constructed to a multilayer consisting of layers having single composition (uniform composition in thickness direction) and formed by a reactive sputtering under a film-forming condition of stable region (so-called metal mode or reaction mode). However, a refractive index n of a film formable under this region is lower than a refractive index n of a film formed under the transition mode region, so, the film is required to be formed thick. In photolithography, a thin phase shift film is advantageous in forming a finer pattern, and further can reduce three-dimensional effect. However, such a thick film constructed by the multilayer is disadvantageous. Further, in the case of the multilayer consisting of layers formed under the film-forming condition of stable region, compositions of the layers are significantly different in every layer. So, it is concerned, in processing the film, that the cross-sectional shape of a pattern is deteriorated due to the difference in etching rate.

The present invention has been made to solve the above problems, and an object of the present invention is to provide a phase shift mask blank and a phase shift mask, including a thin phase shift film having high uniformity in plane, and satisfying a requirement for pattern miniaturization, which is advantageous in terms of patterning and reduction of three-dimensional effect, and with satisfying necessary phase shift and transmittance for the phase shift film even when exposure light is KrF excimer laser having a wavelength of 246 nm.

The inventor has found that, when a phase shift film is composed of a material containing silicon and nitrogen and free of a transition metal and includes a compositionally graded layer having a composition continuously varying in a thickness direction and having optical constants, with respect to exposure light, varying in the thickness direction, the film having a phase shift amount (phase shift) of 170 to 190° and a transmittance of 4 to 8% can be formed without thickening the film of a phase shift mask blank used with exposure light of KrF excimer laser (wavelength of 248 nm), thereby a phase shift mask blank and a phase shift mask including the phase shift film having high in-plain uniformity of optical characteristics are obtained.

In one aspect, the invention provides a phase shift mask blank including a substrate, and a phase shift film thereon, the phase shift film composed of a material containing silicon and nitrogen and free of a transition metal, wherein the phase shift film includes at least one compositionally graded layer having a composition continuously varying in a thickness direction, and a refractive index n and an extinction coefficient k, with respect to exposure light, varying in the thickness direction, the exposure light being KrF excimer laser, the compositionally graded layer has a difference between a maximum refractive index n(H) and a minimum refractive index n(L) of up to 0.40, and a difference between a maximum extinction coefficient k(H) and a minimum extinction coefficient k(L) of up to 1.5.

Preferably, the compositionally graded layer has a minimum refractive index n(L) of at least 2.3 and a maximum extinction coefficient k(H) of up to 2, the compositionally graded layer includes a zone satisfying a refractive index n of at least 2.55 and an extinction coefficient k of up to 1.0, and the zone has a thickness of 5 to 30 nm.

Preferably, the compositionally graded layer has a zone continuously varying a content ratio N/(Si+N) within a range of 0.2 to 0.57 in a thickness direction, the ratio N/(Si+N) representing nitrogen content (at %) to the sum of silicon and nitrogen contents (at %).

Preferably, the compositionally graded layer has a difference between a maximum silicon content (at %) and a minimum silicon content (at %) of up to 30.

Preferably, the phase shift film has a phase shift of 170 to 190° and a transmittance of 4 to 8%, in the phase shift film, a ratio of a deference between a maximum phase shift and a minimum phase shift to an average phase shift in plane of up to 3%, and a ratio of a deference between a maximum transmittance and a minimum transmittance to an average transmittance in plane of up to 5%, and the phase shift film has a thickness of up to 90 nm.

Preferably, the material containing silicon and nitrogen and free of a transition metal is a material consisting of silicon and nitrogen.

Typically, the phase shift mask blank may include a second layer consisting of a single layer or multiple layers on the phase shift film, the second layer being composed of a chromium-containing material.

In another aspect, the invention provides a phase shift mask manufactured by using the phase shift mask blank.

Advantageous Effects of the Invention

According to the invention, there is provided a phase mask blank and a phase shift mask having a thinner phase shift film which is advantageous in terms of patterning and exposure and has high in-plain uniformity of optical characteristics, with satisfying necessary phase shift and transmittance for the phase shift film used in exposure light of KrF excimer laser.

DESCRIPTION OF THE PREFERRED EMBODIMENTS

The phase shift mask blank of the invention includes a transparent substrate such as a quartz substrate, and a phase shift film that is provided on the transparent substrate. The phase shift mask of the invention includes a transparent substrate such as a quartz substrate, and a mask pattern (photomask pattern) of a phase shift film which is provided on the transparent substrate.

The transparent substrate in the invention is preferably, for example, a 6 inch square, 0.25 inch thick transparent substrate, called 6025 substrate specified by the SEMI standard, which is often denoted by a 152 mm square, 6.35 mm thick transparent substrate, according to the SI unit system.

Figure 1A:
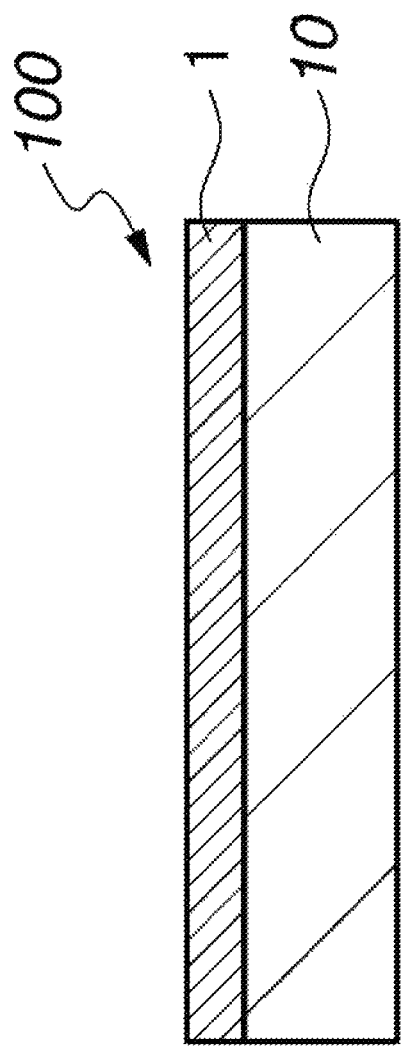
FIGS. 1A and 1B are cross-sectional views illustrating an exemplary phase shift mask blank and a phase shift mask of the invention.
Figure 1B:
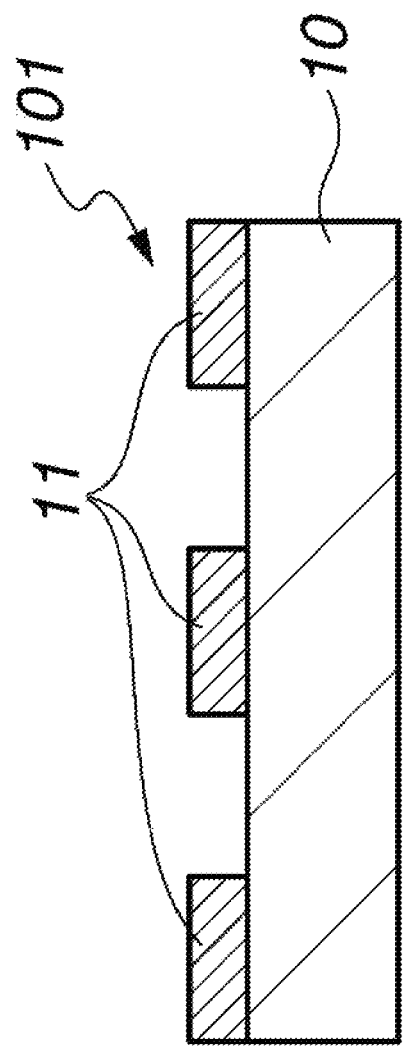

FIG. 1A is a cross-sectional view illustrating an exemplary phase shift mask blank of the invention. In this embodiment, a phase shift mask blank 100 includes a transparent substrate 10, and a phase shift film 1 formed on the transparent substrate 10. FIG. 1B is a cross-sectional view illustrating an exemplary phase shift mask of the invention. In this embodiment, the phase shift mask 101 includes the transparent substrate 10, and a phase shift film pattern 11 formed on the transparent substrate 10. A phase shift mask can be obtained by using a phase shift mask blank and forming a pattern of its phase shift film.

The phase shift film in the invention, with a prescribed thickness, has a predetermined phase shift amount (phase shift) and a predetermined transmittance, with respect to exposure light of KrF excimer laser (wavelength: 248 nm). The phase shift film of the invention is composed of a material containing silicon and nitrogen and free of a transition metal. To improve washing resistance of the film, it is effective to add oxygen to the phase shift film. Thus, the material containing silicon and nitrogen and free of a transition metal may contain oxygen in addition to silicon and nitrogen. However, the refractive index n of the film is reduced when oxygen is added, so, the film thickness tends to be increased. Therefore, as the material containing silicon and nitrogen and free of a transition metal, a material consisting essentially of silicon and nitrogen (a material consisting of two of the elements and inevitable impurities) is preferable.

The phase shift film preferably consists of a single layer which is designed so as to satisfy necessary phase shift and transmittance for the phase shift film. The phase shift film may consist of a plurality of layers which are designed so as to satisfy necessary phase shift and transmittance for the whole of the phase shift film. In each case of the single layer and the plurality of layers, the phase shift film is constructed so that the film includes at least one compositionally graded layer having a composition continuously varying in a thickness direction, and a refractive index n and an extinction coefficient k, with respect to exposure light, varying in the thickness direction. In case of the plurality of layers, although the film may be constructed by a plurality of the compositionally graded layers or a combination of the compositionally graded layer and a single composition layer (a layer not varying in the thickness direction), the total thickness of the compositionally graded layer(s) are preferably at least 30%, more preferably at least 50%, most preferably 100% of the whole thickness of the phase shift film.

In the compositionally graded layer, a difference between a maximum refractive index n(H) and a minimum refractive index n(L) is preferably up to 0.40, more preferably up to 0.25, and preferably at least 0.1, more preferably 0.15. In the compositionally graded layer, a difference between a maximum extinction coefficient k(H) and a minimum extinction coefficient k(L) of up to 1.5, more preferably up to 1.2, and preferably at least 0.3, more preferably at least 0.6. The minimum refractive index n(L) in the compositionally graded layer is preferably at least 2.3, more preferably at least 2.4, and the maximum extinction coefficient k(H) is preferably up to 2, more preferably up to 1.5. Particularly, in the compositionally graded layer, the thickness of a zone satisfying a refractive index n of at least 2.55 and an extinction coefficient k of up to 1.0 is preferably at least 5 nm and up to 30 nm.

In the compositionally graded layer of the invention, a compositionally graded range of silicon content is preferably within at least 40 at %, particularly at least 45 at %, and up to 70 at %, particularly up to 60 at %, and a compositionally graded range of nitrogen content is preferably within at least 30 at %, particularly at least 40 at %, and up to 60 at %, particularly up to 55 at %, in the whole of the compositionally graded layer when the phase shift film is constructed by a single layer, and in each of the layers when the phase shift film is constructed by a plurality of the compositionally graded layers.

In particular, the compositionally graded layer preferably includes a zone continuously varying a content ratio N/(Si+N) which represents nitrogen content (at %) to the sum of silicon and nitrogen contents (at %), within a range of preferably at least 0.2, more preferably at least 0.3, and preferably up to 0.57, more preferably 0.55. A difference between a maximum silicon content (at %) and a minimum silicon content (at %) in the compositionally graded layer is preferably up to 30, more preferably up to 15. In case that the compositionally graded layer contains oxygen, an oxygen content is preferably up to 30 at %, more preferably up to 10 at %, most preferably up to 5 at %.

The phase shift of the exposure light which passes through the phase shift film in the invention may be enough to be able to increase contrast at the boundary between an area having the phase shift film (phase shift area) and an area without the phase shift film, as a result of phase shift due to interference of exposure lights passing through the respective areas. The phase shift may be at least 170° and up to 190°. Meanwhile, a transmittance of the phase shift film in the invention may be at least 4% and up to 8% with respect to exposure light. The phase shift film in the invention may have the phase shift and the transmittance with respect to KrF excimer laser (wavelength: 248 nm), controlled within the aforementioned range.

The phase shift film is constructed so as to include at least one compositionally graded layer having a composition continuously varying in a thickness direction, and a refractive index n and an extinction coefficient k, with respect to exposure light, varying in the thickness direction. According to the phase shift film of the invention, a variation range of the phase shift which is a ratio of a difference between maximum and minimum phase shifts per an average phase shift, in-plain (for example, within 135 mm square area at the center of a substrate surface for a 6025 substrate) of the phase shift film, may be up to 3%, particularly up to 1%, and a variation range of the transmittance which is a ratio of a difference between maximum and minimum transmittances per an average transmittance, in-plain of the phase shift film, may be up to 5%, particularly up to 3%.

When a whole thickness of the phase shift film is thin, fine patterns can be readily formed. Thus, the whole thickness of the phase shift film in the invention is up to 90 nm, preferably up to 85 nm. Meanwhile, the lower limit of the thickness of the phase shift film may be set so long as the desired optical characteristics may be obtained with exposure light, and is typically at least 50 nm, however not limited thereto.

The phase shift film in the invention may be formed by known methods for forming film. The phase shift film is preferably formed by sputtering by which highly homogenous film is easily obtainable, and the sputtering may be either DC sputtering or RF sputtering. Target and sputtering gas are properly selected depending on kind and composition of the layer to be formed. Examples of the target include silicon target, silicon nitride target, and a target containing both of silicon and silicon nitride. These targets may contain oxygen. The nitrogen content and the oxygen content may be controlled by reactive sputtering using any of reactive gases as a sputtering gas such as a nitrogen-containing gas, an oxygen-containing gas, and a nitrogen and oxygen-containing gas under properly controlling an amount of feeding. In particular, nitrogen gas ($N_2$ gas), oxygen gas ($O_2$ gas), and nitrogen oxide gases ($N_2O$ gas, NO gas and $NO_2$ gas) may be used for the reactive gas. Rare gases such as helium gas, neon gas and argon gas are also employable as the sputtering gas.

The phase shift film consisting multiple layers may include an oxidized surface layer formed as the outermost layer on the top face (on the side remote from the transparent substrate), for the purpose of suppressing change of properties of the phase shift film. The oxidized surface layer may have an oxygen content of at least 20 at %, preferably at least 50 at %. Examples of methods for forming the oxidized surface layer specifically include atmospheric oxidation (natural oxidation); and forced oxidation treatment such as treatment of a sputtered film with ozone gas or ozonated water, or heating at least 300° C. in an oxygen-containing atmosphere such as oxygen gas atmosphere, by heating in oven, lamp annealing or laser heating. The oxidized surface layer preferably has a thickness of up to 10 nm, more preferably up to 5 nm, most preferably up to 3 nm. An effect of the oxidized surface layer is obtainable typically with a thickness of at least 1 nm. While the oxidized surface layer may be formed by sputtering under an increased oxygen amount, the oxidized surface layer is more preferably formed by the aforementioned atmospheric oxidation or oxidation treatment in terms of obtaining the layer with fewer defects.

The phase shift mask blank of the invention may include a second layer consisting of a single layer or multiple layers, and is formed over the phase shift film. The second layer is usually provided adjacent to the phase shift film. The second layer is specifically exemplified by a light shielding film, a combination of a light shielding film and an antireflection film, and a process-aid film that functions as a hard mask in the process of patterning the phase shift film. In case where a third layer is employed as described below, the second layer may be used as a process-aid film that functions as an etching stopper (etching stopper film) in the process of patterning the third layer. Material of the second layer is preferably a chromium-containing material.

Figure 2A:
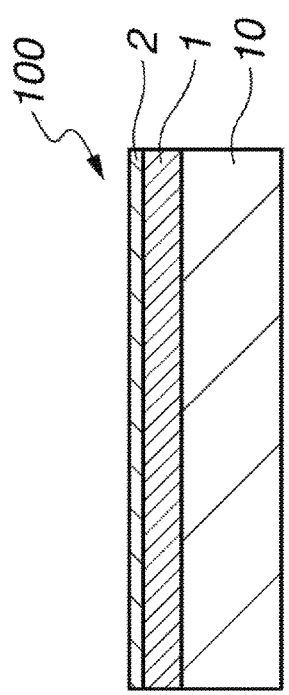
FIGS. 2A to 2C are cross-section views illustrating other examples of a phase shift mask blank of the invention.

This embodiment is specifically exemplified by a phase shift mask blank illustrated in FIG. 2A. FIG. 2A is a cross-sectional view illustrating an exemplary phase shift mask blank of the invention. In this embodiment, a phase shift mask blank 100 includes a transparent substrate 10, a phase shift film 1 formed on the transparent substrate 10, and a second layer 2 formed on the phase shift film 1.

The phase shift mask blank of the invention may include a light shielding film or an etching mask film which functions as a hard mask when a pattern is formed to a phase shift film, as the second layer, provided over the phase shift film. Alternatively, a light shielding film and an antireflection film may be combined to form the second layer. The second layer including a light shielding film can provide an area that is fully block the exposure light in a phase shift mask. The light shielding film and the antireflection film may also be used as a process-aid film in the etching. There are many reports regarding film structure and materials for the light shielding film and antireflection film (JP-A 2007-33469 (Patent Document 2), JP-A 2007-233179 (Patent Document 3), for example). Preferred film structure having the light shielding film and the antireflection film combined therein is exemplified by a structure in which a light shielding film composed of a chromium-containing material is provided, and an antireflection film composed of a chromium-containing material for reducing reflection from the light shielding film is further provided. The light shielding film and the antireflection film may consist of a single layer or multiple layers. Examples of the chromium-containing material of the light shielding film and the antireflection film include chromium (simple substance), and a chromium compound such as chromium oxide (CrO), chromium nitride (CrN), chromium carbide (CrC), chromium oxynitride (CrON), chromium oxycarbide (CrOC), chromium nitride carbide (CrNC) and chromium oxynitride carbide (CrONC). Notably, the chemical formulae that represent the chromium-containing materials merely denote constituent elements, rather than compositional ratios of the constituent elements (the same shall apply to the chromium-containing materials hereinafter).

For the second layer as the light shielding film, or the combination of a light shielding film and an antireflection film, the chromium compound in the light shielding film has a chromium content of preferably at least 40 at %, more preferably at least 60 at %, and preferably less than 100 at %, more preferably up to 99 at %, most preferably up to 90 at %. The oxygen content is preferably up to 60 at %, more preferably up to 40 at %, and preferably at least 1 at %. The nitrogen content is preferably up to 50 at %, more preferably up to 40 at %, and preferably at least 1 at %. The carbon content is preferably up to 20 at %, more preferably up to 10 at %, and if the etching rate is necessarily adjusted, preferably at least 1 at %. In this case, a total content of chromium, oxygen, nitrogen and carbon is preferably at least 95 at %, more preferably at least 99 at %, and most preferably 100 at %.

For the second layer as the combination of a light shielding film and an antireflection film, the antireflection film is preferably composed of a chromium compound, and the chromium compound has a chromium content of preferably at least 30 at %, more preferably at least 35 at %, and up to 70 at %, more preferably up to 50 at %. The oxygen content is preferably up to 60 at %, and preferably at least 1 at %, more preferably at least 20 at %. The nitrogen content is preferably up to 50 at %, more preferably up to 30 at %, and preferably at least 1 at %, more preferably at least 3 at %. The carbon content is preferably up to 20 at %, more preferably up to 5 at %, and if the etching rate is necessarily adjusted, preferably at least 1 at %. In this case, a total content of chromium, oxygen, nitrogen and carbon is preferably at least 95 at %, more preferably at least 99 at %, most preferably 100 at %.

For the second layer as the light shielding film, or the combination of a light shielding film and an antireflection film, the second layer has a thickness of usually 20 to 100 nm, and preferably 40 to 70 nm. A total optical density of the phase shift film and the second layer are preferably at least 2.0, more preferably at least 2.5, most preferably at least 3.0, with respect to exposure light.

Over the second layer of the phase shift mask blank of the invention, a third layer consisting of a single layer or multiple layers may be provided. The third layer is usually provided adjacent to the second layer. The third layer is specifically exemplified by a process-aid film that functions as a hard mask in the process of patterning the second layer, a light shielding film, and a combination of a light shielding film and an antireflection film. A material composing the third layer is preferably a silicon-containing material, particularly a silicon-containing material free of chromium.

Figure 2B:
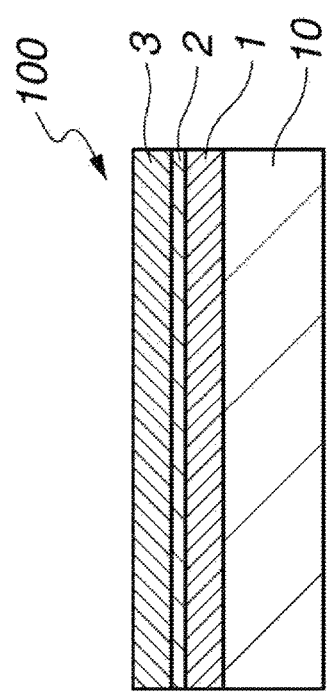

This embodiment is specifically exemplified by a phase shift mask blank illustrated in FIG. 2B. FIG. 2B is a cross-sectional view illustrating an exemplary phase shift mask blank of the invention. In this embodiment, the phase shift mask blank 100 includes a transparent substrate 10, a phase shift film 1 formed on the transparent substrate 10, a second layer 2 formed on the phase shift film 1, and a third layer 3 formed on the second layer 2.

For the second layer as the light shielding film, or the combination of a light shielding film and an antireflection film, a process-aid film (etching mask film) which functions as a hard mask in the process of patterning the second layer may be provided as the third layer. In case where a fourth layer is employed as described below, the third layer may be used as a process-aid film that functions as an etching stopper (etching stopper film) in the process of patterning the fourth layer. The process-aid film is preferably composed of a material that differs in etching characteristics from the second layer, such as a material resistant to chlorine-based dry etching for a chromium-containing material, in particular, a silicon-containing material which can be etched by fluorine-containing gases such as $SF_6$ and $CF_4$. Examples of the silicon-containing material include silicon (simple substance), and a silicon compound such as a material containing silicon, and either or both of nitrogen and oxygen, a material containing silicon and a transition metal, and a material containing silicon, and either or both of nitrogen and oxygen with a transition metal. Examples of the transition metal include molybdenum, tantalum and zirconium.

For the third layer as the process-aid film, the process-aid film is preferably composed of a silicon compound. The silicon compound has a silicon content of preferably at least 20 at %, more preferably at least 33 at %, and preferably up to 95 at %, and more preferably up to 80 at %. The nitrogen content is preferably up to 50 at %, more preferably up to 30 at %, and preferably at least 1 at %. The oxygen content is preferably up to 70 at %, more preferably up to 66 at %, and if the etching rate is necessarily adjusted, preferably at least 1 at %, more preferably at least 20 at %. A transition metal may be contained or not in the third layer. When the transition metal is contained the transition metal content is preferably up to 35 at %, more preferably up to 20 at %. In this case, a total content of silicon, oxygen, nitrogen and transition metal is preferably at least 95 at %, more preferably at least 99 at %, most preferably 100 at %.

For the second layer as the light shielding film, or the combination of a light shielding film and an antireflection film, and for the third layer as the process-aid film, the second layer has a thickness of usually 20 to 100 nm, and preferably 40 to 70 nm, and the third layer typically has a thickness of usually 1 to 30 nm, and preferably 2 to 15 nm. A total optical density of the phase shift film and the second layer are preferably at least 2.0, more preferably at least 2.5, most preferably at least 3.0, with respect to exposure light.

For the second layer as the process-aid film, a light shielding film may be provided as the third layer. The light shielding film in combination with the antireflection film may be provided as the third layer. In this case, the second layer may be used as a process-aid film (etching mask film) that functions as a hard mask in the process of patterning the phase shift film, and as a process-aid film (etching stopper film) in the process of patterning the third layer. The process-aid film is exemplified by a film composed of a chromium-containing material, such as disclosed in JP-A 2007-241065 (Patent Document 4). The process-aid film may consist of a single layer or multiple layers. Examples of the chromium-containing material of the process-aid film include chromium (simple substance), and a chromium compound such as chromium oxide (CrO), chromium nitride (CrN), chromium carbide (CrC), chromium oxynitride (CrON), chromium oxycarbide (CrOC), chromium nitride carbide (CrNC) and chromium oxynitride carbide (CrONC).

For the second layer as the process-aid film, the chromium compound in the second layer has a chromium content of preferably at least 40 at %, more preferably at least 50 at %, and preferably up to 100 at %, more preferably up to 99 at %, most preferably up to 90 at %. The oxygen content is preferably up to 60 at %, more preferably up to 55 at %, and if the etching rate is necessarily adjusted, preferably at least 1 at %. The nitrogen content is preferably up to 50 at %, more preferably up to 40 at %, and preferably at least 1 at %. The carbon content is preferably up to 20 at %, more preferably up to 10 at %, and if the etching rate is necessarily adjusted, preferably at least 1 at %. In this case, a total content of chromium, oxygen, nitrogen and carbon is preferably at least 95 at %, particularly at least 99 at %, most preferably 100 at %.

The light shielding film and the antireflection film as the third layer are preferably composed of a material that differs in etching characteristics from the second layer, such as a material resistant to chlorine-based dry etching for a chromium-containing material, in particular, a silicon-containing material which can be etched by fluorine-containing gases such as $SF_6$ and $CF_4$. Examples of the silicon-containing material include silicon (simple substance), and a silicon compound such as a material containing silicon, and either or both of nitrogen and oxygen, a material containing silicon and a transition metal, and a material containing silicon, and either or both of nitrogen and oxygen with a transition metal. Examples of the transition metal include molybdenum, tantalum and zirconium.

For the third layer as the light shielding film, or the combination of a light shielding film and an antireflection film, the light shielding film and the antireflection film are preferably composed of a silicon compound. The silicon compound has a silicon content of preferably at least 10 at %, more preferably at least 30 at %, and preferably less than 100 at %, more preferably up to 95 at %. The nitrogen content is preferably up to 50 at %, preferably up to 40 at %, and most preferably up to 20 at %, and if the etching rate is necessarily adjusted, preferably at least 1 at %. The oxygen content is preferably up to 60 at %, more preferably up to 30 at %, and if the etching rate is necessarily adjusted, preferably at least 1 at %. The transition metal content is preferably up to 35 at %, preferably up to 20 at %, and preferably at least 1 at %. In this case, a total content of silicon, oxygen, nitrogen and transition metal is preferably at least 95 at %, more preferably at least 99 at %, most preferably 100 at %.

For the second layer as the process-aid film, and for the third layer as the light shielding film, or the combination of a light shielding film and an antireflection film, the second layer has a thickness of usually 1 to 20 nm, and preferably 2 to 10 nrn, and the third layer has a thickness of usually 20 to 100 nm, and preferably 30 to 70 nm. A total optical density of the phase shift film, the second layer and the third layer are preferably at least 2.0, more preferably at least 2.5, most preferably at least 3.0, with respect to exposure light.

Over the third layer of the phase shift mask blank of the invention, a fourth layer consisting of a single layer or multiple layers may be provided. The fourth layer is usually provided adjacent to the third layer. The fourth layer is specifically exemplified by a process-aid film that functions as a hard mask in the process of patterning the third layer. A material of the fourth layer is preferably a chromium-containing material.

Figure 2C:
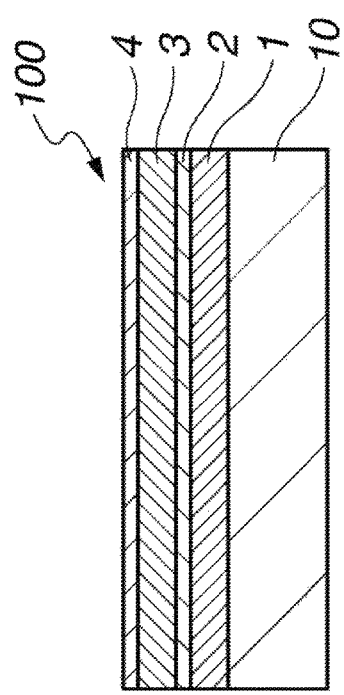

This embodiment is specifically exemplified by a phase shift mask blank illustrated in FIG. 2C. FIG. 2C is a cross-sectional view illustrating an exemplary phase shift mask blank of the invention. In this embodiment, the phase shift mask blank 100 includes a transparent substrate 10, a phase shift film 1 formed on the transparent substrate 10, a second layer 2 formed on the phase shift film 1, a third layer 3 formed on the second layer 2, and a fourth layer 4 formed on the third layer 3.

For the third layer as the light shielding film, or the combination of a light shielding film and an antireflection film, a process-aid film (etching mask film) which functions as a hard mask in the process of patterning the third layer may be provided as the fourth layer. The process-aid film is preferably composed of a material that differs in etching characteristics from the third layer, such as a material resistant to fluorine-based dry etching for a silicon-containing material, in particular, a chromium-containing material which can be etched by chlorine-based gases containing oxygen. The chromium-containing material is exemplified by chromium (simple substance), and a chromium compound such as chromium oxide (CrO), chromium nitride (CrN), chromium carbide (CrC), chromium oxynitride (CrON), chromium oxycarbide (CrOC), chromium nitride carbide (CrNC) and chromium oxynitride carbide (CrONC).

For the fourth layer as the process-aid film, the fourth layer has a chromium content of preferably at least 40 at %, more preferably at least 50 at %, and preferably up to 100 at %, more preferably up to 99 at %, most preferably up to 90 at %. The oxygen content is preferably up to 60 at %, more preferably up to 40 at %, and if the etching rate is necessarily adjusted, preferably at least 1 at %. The nitrogen content is preferably up to 50 at %, more preferably up to 40 at %, and if the etching rate is necessarily adjusted, preferably at least 1 at %. The carbon content is preferably up to 20 at %, more preferably up to 10 at %, and if the etching rate is necessarily adjusted, preferably at least 1 at %. In this case, a total content of chromium, oxygen, nitrogen and carbon is preferably at least 95 at %, more preferably at least 99 at %, most preferably 100 at %.

For the second layer as the process-aid film, for the third layer as the light shielding film, or the combination of a light shielding film and an antireflection film, and for the fourth layer as the process-aid film, the second layer has a thickness of usually 1 to 20 nm, and preferably 2 to 10 nm, the third layer has a thickness of usually 20 to 100 nm, and preferably 30 to 70 nm, and the fourth layer has a thickness of usually 1 to 30 nm, and preferably 2 to 20 nm. A total optical density of the phase shift film, the second layer and the third layer are preferably at least 2.0, more preferably at least 2.5, most preferably at least 3.0, with respect to exposure light.

The film composed of the chromium-containing material for the second layer and the fourth layer may be formed by reactive sputtering using a target such as chromium target, or a target containing chromium that is added one or more elements selected from the group consisting of oxygen, nitrogen and carbon, and using a sputtering gas containing a rare gas such as Ar, He and Ne that is properly added with a reactive gas selected from the group consisting of an oxygen-containing gas, a nitrogen-containing gas and a carbon-containing gas, according to a composition of the film to be formed.

Meanwhile, the film composed of the silicon-containing material for the third layer may be formed by reactive sputtering using a target such as a silicon target, a silicon nitride target, a target containing both of silicon and silicon nitride, a transition metal target, and a composite target of silicon and transition metal, and using a sputtering gas containing a rare gas such as Ar, He and Ne that is properly added with a reactive gas selected from the group consisting of an oxygen-containing gas, a nitrogen-containing gas and a carbon-containing gas, according to a composition of the film to be formed.

The phase shift mask of the invention may be manufactured by any of usual methods from the phase shift mask blank. From an exemplary phase shift mask blank including a film composed of a chromium-containing material formed as a second layer on a phase shift film, the phase shift mask may be manufactured typically by the following processes.

First, an electron beam resist film is formed on the second layer of the phase shift mask blank, a pattern is drawn by electron beam, followed by a predetermined operation of development, to obtain a resist pattern. Next, the obtained resist pattern is used as an etching mask, and the resist pattern is transferred to the second layer by chlorine-based dry etching containing oxygen, to obtain a second layer pattern. Next, the obtained second layer pattern is used as an etching mask, and the second layer pattern is transferred to the phase shift film by fluorine-based dry etching, to obtain a phase shift film pattern. In case where a part of the second layer is needed to be remained, another resist pattern that protects such part to be remained is formed on the second layer, and a part of the second layer not protected with the resist pattern is removed by chlorine-based dry etching containing oxygen. The resist pattern is then removed by a usual method to obtain the phase shift mask.

From an exemplary phase shift mask blank including a light shielding film or a combination of a light shielding film and an antireflection film, composed of a chromium-containing material, as a second layer on a phase shift film, and a process-aid film composed of a silicon-containing material as a third layer on the second layer, the phase shift mask may be manufactured typically by the following processes.

First, an electron beam resist film is formed on the third layer of the phase shift mask blank, a pattern is drawn by electron beam, followed by a predetermined operation of development, to obtain a resist pattern. Next, the obtained resist pattern is used as an etching mask, and the resist pattern is transferred to the third layer by fluorine-based dry etching, to obtain a third layer pattern. Next, the obtained third layer pattern is used as an etching mask, and the third layer pattern is transferred to the second layer by chlorine-based dry etching containing oxygen, to obtain a second layer pattern. The resist pattern is then removed, and the obtained second layer pattern is used as an etching mask, and the second layer pattern is transferred to the phase shift film by fluorine-based dry etching, to obtain a phase shift film pattern and to concurrently remove the third layer pattern. Next, another resist pattern that protects a part of the second layer to be remained is formed on the second layer, and a part of the second layer not protected with the resist pattern is removed by chlorine-based dry etching containing oxygen. The resist pattern is then removed by a usual method to obtain the phase shift mask.

Meanwhile, from an exemplary phase shift mask blank including a process-aid film composed of a chromium-containing material as a second layer on a phase shift film, and a light shielding film or a combination of a light shielding film and an antireflection film, composed of a silicon-containing material, as a third layer on the second layer, the phase shift mask may be manufactured typically by the following processes.

First, an electron beam resist film is formed on the third layer of the phase shift mask blank, a pattern is drawn by electron beam, followed by a predetermined operation of development, to obtain a resist pattern. Next, the obtained resist pattern is used as an etching mask, and the resist pattern is transferred to the third layer by fluorine-based dry etching, to obtain a third layer pattern. Next, the obtained third layer pattern is used as an etching mask, and the third layer pattern is transferred to the second layer by chlorine-based dry etching containing oxygen, to obtain a second layer pattern that a part where the phase shift film will be removed has been removed. The resist pattern is then removed. Next, another resist pattern that protects a part of the third layer to be remained is formed on the third layer, and the obtained second layer pattern is used as an etching mask, and the second layer pattern is transferred to the phase shift film by fluorine-based dry etching, to obtain a phase shift film pattern, and to concurrently remove a part of the third layer which is not protected with the resist pattern. The resist pattern is then removed by a usual method. Further, the part of the second layer, which is exposed in the part where the third layer has been removed, is then removed by chlorine-based dry etching containing oxygen, to obtain the phase shift mask.

Further, from an exemplary phase shift mask blank including a process-aid film composed of a chromium-containing material as a second layer on a phase shift film, a light shielding film or a combination of a light shielding film and an antireflection film, composed of a silicon-containing material, as a third layer on the second layer, and a process-aid film composed of a chromium-containing material, as a fourth layer on the third layer, the phase shift mask may be manufactured typically by the following processes.

First, an electron beam resist film is formed on the fourth layer of the phase shift mask blank, a pattern is drawn by electron beam, followed by a predetermined operation of development, to obtain a resist pattern. Next, the obtained resist pattern is used as an etching mask, and the resist pattern is transferred to the fourth layer by chlorine-based dry etching containing oxygen, to obtain a fourth layer pattern. Next, the obtained fourth layer pattern is used as an etching mask, and the fourth layer pattern is transferred to the third layer by fluorine-based dry etching, to obtain a third layer pattern. The resist pattern is then removed. Next, another resist pattern that protects a part of the third layer to be remained is formed on the fourth layer, and the obtained third layer pattern is used as an etching mask, and the third layer pattern is transferred to the second layer by chlorine-based dry etching containing oxygen, to obtain a second layer pattern, and to concurrently remove a part of the fourth layer which is not protected with the resist pattern. Next, the second layer pattern is used as an etching mask, and the second layer pattern is transferred to the phase shift film by fluorine-based dry etching, to obtain a phase shift film pattern, and to concurrently remove a part of the third layer which is not protected with the resist pattern. The resist pattern is then removed by a usual method. Further, the part of the second layer, which is exposed in the part where the third layer has been removed, and the part of the fourth layer exposed in the part where the resist pattern has been removed, are then removed by chlorine-based dry etching containing oxygen, to obtain the phase shift mask.

EXAMPLES

Examples of the invention are given below by way of illustration and not by way of limitation.

Example 1

A 152 mm square, 6.35 mm thick 6025 quartz substrate was placed in a chamber of a sputtering apparatus, and a single-layer phase shift film composed of SiN that is a compositionally graded layer having a composition continuously varying in a thickness direction, and having optical characteristics varying in the thickness direction was formed thereon by using a silicon target as a sputtering target, and argon gas and nitrogen gas as a sputtering gas, under the conditions of a discharge power of 1.9 kW, a flow rate of argon gas of 28 sccm, and a flow rate of nitrogen gas continuously varied from 20 to 44 sccm.

With respect to KrF excimer layer (wavelength of 248 nm), the compositionally graded layer had a maximum refractive index n(H) of 2.61, a minimum refractive index n(L) of 2.33, and the difference between the refractive indexes n was 0.28; a maximum extinction coefficient k(H) of 1.4, a minimum extinction coefficient k(L) of 0.05, and the difference between the extinction coefficients k was 1.35, and had a zone having a refractive index n in the range of at least 2.55, an extinction coefficient k in the range of up to 1.0, and a thickness of approx. 15 nm.

The film had a continuously varied silicon content of 58.5 at % to 46.8 at %, analyzed by XPS (X-ray photoelectron spectroscopy, the same shall apply hereinafter), in the thickness direction from the quartz substrate side, and the difference between the contents was 11.7. The film had a continuously varied content ratio N/(Si+N) from 0.41 to 0.52 in the thickness direction. The phase shift film had a thickness of 87 nm, a phase shift of 177.5° and a transmittance of 5.9%, with respect to KrF excimer laser (wavelength of 248 nm). A variation ranges of the phase shift and the transmittance in-plane were, respectively, 0.4% and 1.9% that were favorable.

Example 2

A 152 mm square, 6.35 mm thick 6025 quartz substrate was placed in a chamber of a sputtering apparatus, and a single-layer phase shift film composed of SiN that is a compositionally graded layer having a composition continuously varying in a thickness direction, and having optical characteristics varying in the thickness direction was formed thereon by using a silicon target as a sputtering target, and argon gas and nitrogen gas as a sputtering gas, under the conditions of a discharge power of 1.9 kW, a flow rate of argon gas of 28 sccm, and a flow rate of nitrogen gas continuously varied from 19 to 43 sccm.

With respect to KrF excimer layer (wavelength of 248 nm), the compositionally graded layer had a maximum refractive index n(H) of 2.61, a minimum refractive index n(L) of 2.33, and the difference between the refractive indexes n was 0.28; a maximum extinction coefficient k(H) of 1.5, a minimum extinction coefficient k(L) of 0.05, and the difference between the extinction coefficients k was 1.45, and had a zone having a refractive index n in the range of at least 2.55, an extinction coefficient k in the range of up to 1.0, and a thickness of approx. 15 nm.

The film had a continuously varied silicon content of 59.1 at % to 46.5 at %, analyzed by XPS, in the thickness direction from the quartz substrate side, and the difference between the contents was 12.6. The film had a continuously varied content ratio N/(Si+N) from 0.40 to 0.53 in the thickness direction. The phase shift film had a thickness of 85 nm, a phase shift of 176.1° and a transmittance of 5.8%, with respect to KrF excimer laser (wavelength of 248 nm). A variation ranges of the phase shift and the transmittance in-plane were, respectively, 0.9% and 1.7% that were favorable.

Example 3

A 152 mm square, 6.35 mm thick 6025 quartz substrate was placed in a chamber of a sputtering apparatus, and a single-layer phase shift film composed of SiON that is a compositionally graded layer having a composition continuously varying in a thickness direction, and having optical characteristics varying in the thickness direction was formed thereon by using a silicon target as a sputtering target, and argon gas, oxygen gas and nitrogen gas as a sputtering gas, under the conditions of a discharge power of 1.9 kW, a flow rate of argon gas of 28 sccm, a flow rate of oxygen gas of 1.0 sccm, and a flow rate of nitrogen gas continuously varied from 19 to 43 sccm.

With respect to KrF excimer layer (wavelength of 248 nm), the compositionally graded layer had a maximum refractive index n(H) of 2.59, a minimum refractive index n(L) of 2.30, and the difference between the refractive indexes n was 0.29; a maximum extinction coefficient k(H) of 1.4, a minimum extinction coefficient k(L) of 0.05, and the difference between the extinction coefficients k was 1.35, and had a zone having a refractive index n in the range of at least 2.55, an extinction coefficient k in the range of up to 1.0, and a thickness of approx. 14 nm.

The film had a continuously varied silicon content of 56.7 at % to 45.4 at %, analyzed by XPS, in the thickness direction from the quartz substrate side, and the difference between the contents was 11.3. The film had a continuously varied content ratio N/(Si+N) from 0.42 to 0.52 in the thickness direction. The film had a substantively constant oxygen content of 2 at % in the thickness direction. The phase shift film had a thickness of 88 nm, a phase shift of 177.5° and a transmittance of 6.0%, with respect to KrF excimer laser (wavelength of 248 nm). A variation ranges of the phase shift and the transmittance in-plane were, respectively, 0.4% and 0.8% that were favorable.

Comparative Example 1

A 152 mm square, 6.35 mm thick 6025 quartz substrate was placed in a chamber of a sputtering apparatus, and a two-layer phase shift film consisting of a lower layer and an upper layer was formed by using a silicon target as a sputtering target, and argon gas and nitrogen gas as a sputtering gas, under the conditions of a discharge power of 1.9 kW, a flow rate of argon gas of 28 sccm, and a flow rate of nitrogen of 19 sccm, for the lower layer (thickness: 27 nm) composed of SiN that has a constant composition in the thickness direction and optical characteristics not varying in the thickness direction; and by using the same target and gases under the same conditions other than a changed flow rate of argon gas of 35 sccm, for the upper layer (thickness: 64 nm) composed of SiN that has a constant composition in the thickness direction and optical characteristics not varying in the thickness direction.

With respect to KrF excimer layer (wavelength of 248 nm), the lower layer had a refractive index n of 2.45, the upper layer had a refractive index n of 2.38, and the difference between the refractive indexes n was 0.07; the lower layer had an extinction coefficient k of 1.5, the upper layer had an extinction coefficient k of 0.07 and the difference between the extinction coefficients k was 1.43, and there was no zone having a refractive index n in the range of at least 2.55 and an extinction coefficient k in the range of up to 1.0.

The film had a silicon content of 59.2 at % in the lower layer, and a silicon content of 46.5 at % in the upper layer, analyzed by XPS, and the difference between the contents was 12.7. The film had a content ratio N/(Si+N) of 0.40 in the lower layer, and a content ratio N/(Si+N) of 0.53 in the upper layer. The phase shift film had a phase shift of 177.0° and a transmittance of 6.2%, with respect to KrF excimer laser (wavelength of 248 nm). A variation ranges of the phase shift and the transmittance in-plane were, respectively, 0.9% and 3.6%, however, the thickness of the film was 91 nm and the film was formed thick.

Comparative Example 2

A 152 mm square, 6.35 mm thick 6025 quartz substrate was placed in a chamber of a sputtering apparatus, and a single-layer phase shift film composed of SiN that has a constant composition in the thickness direction and optical characteristics not varying in the thickness direction was formed by using a silicon target as a sputtering target, and argon gas and nitrogen gas as a sputtering gas, under the conditions of a discharge power of 1.9 kW, a flow rate of argon gas of 28 sccm, and a flow rate of nitrogen of 27 sccm.

With respect to KrF excimer layer (wavelength of 248 nm), the layer had a refractive index n of 2.60 and an extinction coefficient k of 0.7, and the whole of the layer satisfied a refractive index n in the range of at least 2.55 and an extinction coefficient k in the range of up to 1.0.

The film had a silicon content of 50.4 at %, analyzed by XPS. The film had a content ratio N/(Si+N) of 0.49. The phase shift film had a thickness of 79 nm, a phase shift of 177.2° and a transmittance of 4.5%, with respect to KrF excimer laser (wavelength of 248 nm). However, a variation ranges of the phase shift and the transmittance in-plane were, respectively, 0.5% and 11.1%, and the variation range of transmittance was disadvantageous.

Comparative Example 3

A 152 mm square, 6.35 mm thick 6025 quartz substrate was placed in a chamber of a sputtering apparatus, and a single-layer phase shift film composed of MoSiON that has a constant composition in the thickness direction and optical characteristics not varying in the thickness direction was formed by using a molybdenum silicon (MoSi) target and a silicon target as a sputtering target, and argon gas, nitrogen gas and oxygen gas as a sputtering gas, under the conditions of a discharge power of MoSi target of 1.2 kW, a discharge power silicon target of 8 kW, a flow rate of argon gas of 5 sccm, a flow rate of nitrogen of 65 sccm, and a flow rate of oxygen of 2.5 sccm.

With respect to KrF excimer layer (wavelength of 248 nm), the layer had a refractive index n of 2.25 and an extinction coefficient k of 0.52, and there was no zone having a refractive index n in the range of at least 2.55 and an extinction coefficient k in the range of up to 1.0.

The film had a molybdenum content of 14 at %, a silicon content of 35 at %, a nitrogen content of 45 at %, and an oxygen content of 6 at %, analyzed by XPS. The phase shift film had a phase shift of 175.1° and a transmittance of 6.2%, with respect to KrF excimer laser (wavelength of 248 nm). A variation ranges of the phase shift and the transmittance in-plane were, respectively, 0.3% and 1.7%, however, the thickness of the film was 99 nm and the film was formed thick.

Japanese Patent Application Nos. 2019-067065 and 2019-111026 are incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A phase shift mask blank comprising a substrate, and a phase shift film thereon, the phase shift film composed of a material containing silicon and nitrogen and free of a transition metal, wherein the phase shift film has a phase shift of 170° to 190° and a transmittance of 4% to 8%, with respect to exposure light of KrF excimer laser, and a thickness of 85 to 90 nm, the phase shift film comprises at least one compositionally graded layer having a composition continuously varying in a thickness direction, and a refractive index n and an extinction coefficient k, with respect to the exposure light, varying in the thickness direction, and the compositionally graded layer has a difference between a maximum refractive index n(H) and a minimum refractive index n(L) of up to 0.40, and a difference between a maximum extinction coefficient k(H) and a minimum extinction coefficient k(L) of up to 1.5.

2. The phase shift mask blank of claim 1, wherein the compositionally graded layer has a minimum refractive index n(L) of at least 2.3 and a maximum extinction coefficient k(H) of up to 2, the compositionally graded layer comprises a zone satisfying a refractive index n of at least 2.55 and an extinction coefficient k of up to 1.0, and said zone has a thickness of 5 to 30 nm.

3. The phase shift mask blank of claim 1, wherein the compositionally graded layer has a zone continuously varying a content ratio N/(Si+N) within a range of 0.2 to 0.57 in a thickness direction, the ratio N/(Si+N) representing nitrogen content (at %) to the sum of silicon and nitrogen contents (at %).

4. The phase shift mask blank of claim 1, wherein the compositionally graded layer has a difference between a maximum silicon content (at %) and a minimum silicon content (at %) of up to 30.

5. The phase shift mask blank of claim 1, wherein in the phase shift film, a ratio of a deference between a maximum phase shift and a minimum phase shift to an average phase shift in plane of up to 3%, and a ratio of a deference between a maximum transmittance and a minimum transmittance to an average transmittance in plane of up to 5%.

6. The phase shift mask blank of claim 1, wherein the material containing silicon and nitrogen and free of a transition metal is a material consisting of silicon and nitrogen.

7. The phase shift mask blank of claim 1, further comprising a second layer consisting of a single layer or multiple layers on the phase shift film, the second layer being composed of a chromium-containing material.

8. A phase shift mask having a patterned phase shift film manufactured by using the phase shift mask blank of claim 1.

* * * * *